United States Patent [19]
Kato et al.

[11] Patent Number: 6,021,061
[45] Date of Patent: Feb. 1, 2000

[54] SEMICONDUCTOR MEMORY DEVICE

[75] Inventors: Daisuke Kato; Yohji Watanabe, both of Yokohama, Japan

[73] Assignee: Kabushiki Kaisha Toshiba, Kawasaki, Japan

[21] Appl. No.: 09/208,055

[22] Filed: Dec. 9, 1998

[30] Foreign Application Priority Data

Dec. 12, 1997 [JP] Japan ................................ 9-362845

[51] Int. Cl.$^7$ ........................................ G11C 5/02
[52] U.S. Cl. ...................... 365/51; 365/63; 365/230.03
[58] Field of Search ................... 365/51, 63, 230.03, 365/230.06

[56] References Cited

U.S. PATENT DOCUMENTS

| | | | |
|---|---|---|---|
| 5,280,441 | 1/1994 | Wada et al. ............................... | 365/63 |
| 5,517,442 | 5/1996 | Kirihata et al. ........................... | 365/51 |
| 5,636,158 | 6/1997 | Kato et al. ................................ | 365/63 |

OTHER PUBLICATIONS

Watanabe, et al. "A 286 mm$^2$ 256 Mb DRAM with x32 Both–Ends DQ," IEEE Journal of Solid–State Circuits, vol. 31, No. 4, Apr. 1996; pp 567–574.

*Primary Examiner*—David Nelms
*Assistant Examiner*—Hoai V. Ho
*Attorney, Agent, or Firm*—Loeb & Loeb LLP

[57] ABSTRACT

At least one of the row- and column-selection mechanisms, including row- and column decoders, respectively, of a DRAM has a core circuit array and a control circuit array adjacent to each other. The core circuit array has an m-number of core circuit units which are substantially equivalent to each other, and each of which consists of an n-number of core circuits forming the decoders, respectively. The control circuit array has an m-number of control circuit units which are substantially equivalent to each other, and are connected to the core circuit units by interconnection wiring lines, respectively. The core circuit units and the control circuit units are arranged in a first direction with first and second pitches, respectively, which differ from each other. The second pitch is smaller than the first pitch, so that an additional region derived from the difference between the pitches is arranged along with the control circuit units in the first direction, and lead-out wiring lines from the core circuit array are arranged in the additional region.

20 Claims, 4 Drawing Sheets

SEMICONDUCTOR MEMORY DEVICE

BACKGROUND OF THE INVENTION

The present invention relates to a semiconductor memory device, and specifically to a positional relationship between core circuits, such as row decoders or column decoders for selecting memory cells, and control circuits corresponding to the core circuits.

Semiconductor memory devices are constituted mainly by memory cells, which are minimum units for storing data, respectively. Each of the memory cells is an element for storing either a high or low level value. The memory cells are arranged in a matrix format to form the memory cell array of a semiconductor device, such as a DRAM or a clock-synchronism DRAM. The memory cells are selected by word lines in the row directions, and by column-selection lines in the column directions. The word lines and the column-selection lines are connected to a row-selection mechanism and a column-selection mechanism for selecting the lines on the basis of address signals. One of the memory cells in the memory cell array is selected by means of cooperation of the row- and column-selection mechanisms.

Figure 7:
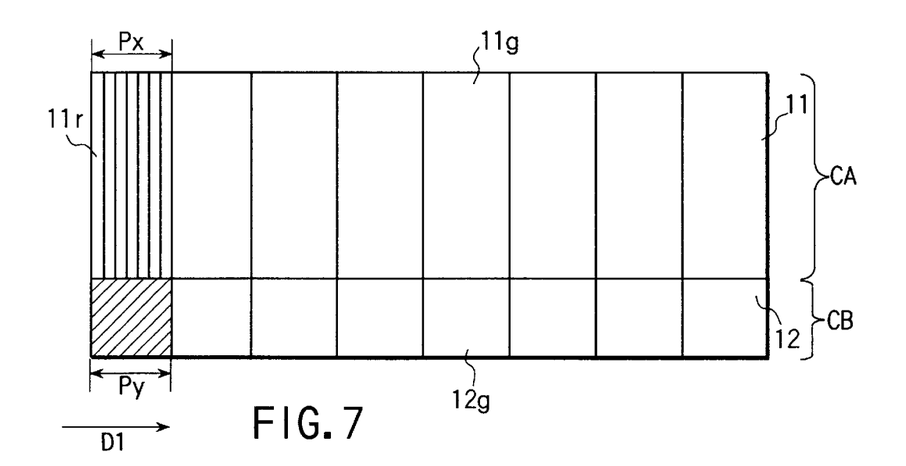
FIG. 7 is a view schematically showing the plan layout of a row-selection mechanism or a column-selection mechanism in a semiconductor memory device according to a related art to the present invention.

FIG. 7 is a view schematically showing the plan layout of a row-selection mechanism or a column-selection mechanism in a semiconductor memory device according to a related art of the present invention.

As shown in FIG. 7, the row- or column-selection mechanism includes an array 11 (or circuit group stage CA) of core circuits, such as row decoders or column decoders, and an array 12 (or circuit group stage CB) of control circuits corresponding to the core circuits.

The core circuit array 11 constituting the circuit group stage CA has an m-number of core circuit units 11g which are substantially the same as or equivalent to each other. Each of the core circuit units 11g consists of an n-number of core circuits 11r which form decoders, respectively. The n-number of core circuits 11r are disposed side by side in a first direction D1, which is parallel to the row or column directions, to constitute each of the core circuit units 11g. The m-number of core circuit units 11g are disposed side by side in the first direction D1 with a pitch Px to constitute the core circuit array 11.

On the other hand, the control circuit array 12 constituting the circuit group stage CB, which is arranged adjacent to the circuit group stage CA, has an m-number of control circuit units 12g which are substantially the same as or equivalent to each other. The control circuit units 12g are connected to the core circuit units 11g by interconnection wiring lines, respectively. The m-number of control circuit units 12g are disposed side by side in the first direction D1 with a pitch Py to constitute the control circuit array 12.

As shown in FIG. 7, the pitches Px and Py of the core circuit units 11g and the control circuit units 12g are set to be the same as each other. In other words, each pair of corresponding core and control circuit units 11g and 12g are arranged to have the same width and be aligned in position with each other in the array direction or first direction D1. Non-corresponding circuits, the number of which does not have to be the same as the m-number of the core circuit units 11g, are arranged outside the circuit group stages CA and CB. Those ones of the lead-out wiring lines from the core circuit array 11, which cannot pass through in the control circuit units 12g, are led out laterally from the circuit group stages CA and CB in the first direction D1.

In the structure shown in FIG. 7, the positional relationship between the core circuit units 11g and the control circuit units 12g, and the positional relationship between the units 11g and 12g and the lead-out wiring lines are restricted, thereby lowering flexibility in design. Further, how to arranged the non-corresponding circuits along with other peripheral circuits outside the circuit group stages CA and CB must be considered, thereby causing the design to be complicated, and causing the occupation surface area of the device or chip to be large.

BRIEF SUMMARY OF THE INVENTION

Therefore, an object of the present invention is to provide a semiconductor memory device having an improved flexibility in design.

Another object of the present invention is to provide a semiconductor memory device occupying a decreased surface area.

According to a first aspect of the present invention, there is provided a semiconductor memory device, comprising: a memory cell array comprising a plurality of memory cells arranged in a matrix format of rows and columns; a plurality of row lines arranged to correspond to the rows, respectively, for selecting the memory cells along the rows; a plurality of column lines arranged to correspond to the columns, respectively, for selecting the memory cells along the columns; a row-selection mechanism connected to the row lines for selecting the row lines, based on address signals; a column-selection mechanism connected to the column lines for selecting the column lines, based on address signals; and a circuit section for writing and reading data into and from memory cells in the memory cell array, selected in sequence by means of cooperation of the row- and column-selection mechanisms.

In the first aspect, at least one of the row- and column-selection mechanisms comprises a core circuit array and a control circuit array arranged adjacent to the core circuit array. The core circuit array comprises an m-number of core circuit units which are substantially equivalent to each other, and each of which consists of an n-number of core circuits forming decoders, respectively. The control circuit array comprises an m-number of control circuit units which are substantially equivalent to each other, and are connected to the core circuit units by interconnection wiring lines, respectively. The core circuit units and the control circuit units are arranged in a first direction with first and second pitches, respectively, which differ from each other.

According to a second aspect, in the semiconductor memory device of the first aspect, the second pitch is smaller than the first pitch, so that an additional region derived from a difference between the first and second pitches is arranged along with the control circuit units in the first direction, and non-corresponding circuits, the number of which does not have to be the same as the m-number of the core circuit units, or lead-out wiring lines from the core circuit array are arranged in the additional region.

According to a third aspect, there is provided a semiconductor memory device having first and second blocks arranged side by side with a gap section interposed therebetween, each of the first and second blocks comprising the semiconductor memory device of the second aspect, wherein lead-out wiring lines from the core circuit array are arranged in the additional region. The lead-out wiring lines from the first block and the lead-out wiring lines from the second block are respectively connected in the gap section.

In the first aspect, the array pitch of the core circuit units and the array pitch of the control circuit units differ from each other. With this arrangement, the positional relationship between the core circuit units and the control circuit units becomes less restricted, thereby increasing flexibility in design.

In the second aspect, the non-corresponding circuits or lead-out wiring lines are arranged in the additional region derived from the difference between the array pitches of the core and control circuit units. With this arrangement, the positional relationship between the lead-out wiring lines and the core and control circuit units becomes less restricted, and the non-corresponding circuits do not come to interfere with other peripheral circuits in the layout of the device. As a result, it is possible to increase flexibility in design, and to decrease the occupation surface area of the device or chip.

In the third aspect, the lead-out wiring lines led out from the first and second blocks, which are arranged side by side, are connected in the gap section. With this arrangement, it is possible to decrease the occupation surface area of the device or chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 4:
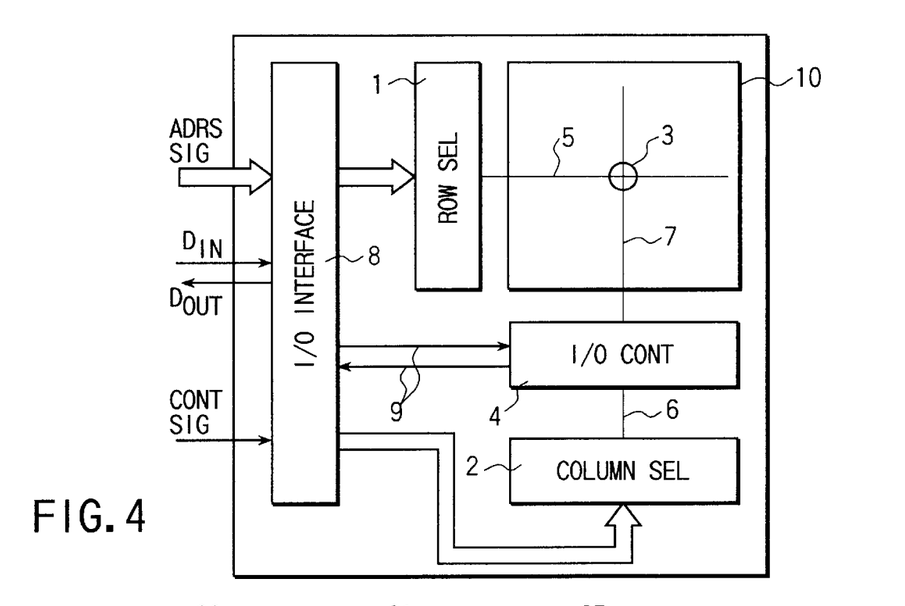
FIG. 4 is a block diagram showing a DRAM which exemplifies a semiconductor memory device according to an embodiment of the present invention.

FIG. 4 is a block diagram showing a DRAM which exemplifies a semiconductor memory device according to an embodiment of the present invention.

As shown in FIG. 4, the DRAM has a memory cell array 10 constituted by a plurality of memory cells 3 which are arranged in a matrix format consisting of rows and columns. A plurality of word (or row) lines 5 corresponding to the rows are arranged to select the memory cells 3 in units of a row in the memory cell array 10. A plurality of column-selection lines 6 corresponding to the columns are arranged to select the memory cells 3 in units of a column in the memory cell array 10. Note that only respective ones of the memory cells 3, the word lines 5, and the column-selection lines 6, and bit lines or pairs of bit lines 7 described later are conceptually shown for the sake of simplicity in FIG. 4.

A row-selection mechanism 1 including row decoders connected to the word lines 5 is arranged to select the word lines 5 with reference to row-address signals. A column-selection mechanism 2 including column decoders connected to the column-selection lines 6 is arranged to select the column-selection lines 6 with reference to column-address signals. The row- and column-address signals are transferred to the row- and column-selection mechanisms 1 and 2, respectively, from an I/O interface circuit 8.

An I/O control circuit 4 is arranged to read and write data from and into the memory cells 3 in the memory cell array 10 which are selected in sequence by means of cooperation of the row- and column-selection mechanisms 1 and 2. The I/O control circuit 4 is connected to the memory cells 3 by the bit lines 7. The I/O control circuit 4 includes a sense amplifier for amplifying signals transferred to the bit lines 7 from the memory cells 3. Writing data and reading data are transferred between the I/O interface circuit 8 and the I/O control circuit 4.

In the DRAM (including an SDRAM), address signals are inputted into the I/O interface circuit 8 in a time-sharing manner in synchronism with row- and column-selection signals, and are latched in row- and column-address buffers. Then, the address signals are transferred to the row- and column-selection mechanisms 1 and 2, and the word lines 5 are selectively driven by the row decoder to access some of the memory cells 3. The data in the accessed memory cells 3 is transferred to the bit lines 7, and amplified by the sense amplifier, while the data are re-written into the memory cells 3 at this time.

Then, some of the outputs of the sense amplifier are selected by the column decoder through the column-selection lines 6, and the selected data is transferred to the I/O interface circuit 8 through data lines 9. The above described sequential operations are carried out in a predetermined order and timing under the control of internal synchronous signals, to prevent the data of the memory cells 3 from being destroyed. By control signals, the data are caused to be transferred and outputted externally through the I/O interface circuit 8.

Figure 1:
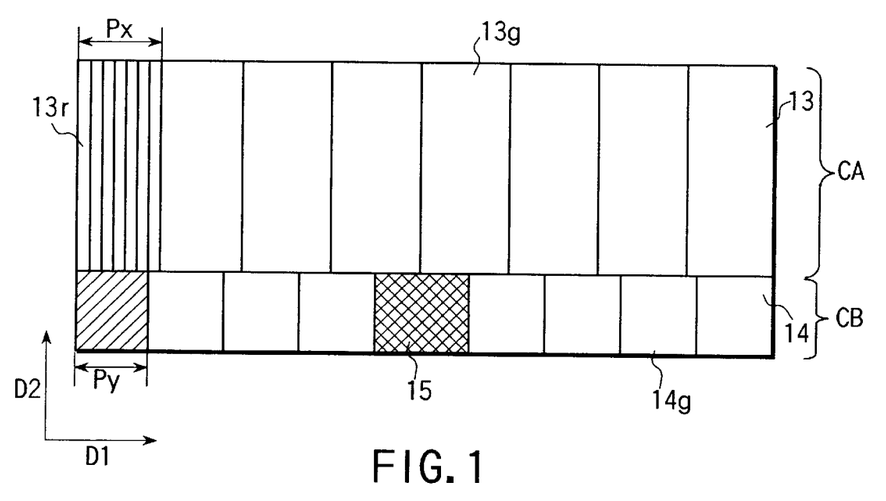
FIG. 1 is a view schematically showing the plan layout of a row-selection mechanism or a column-selection mechanism in the semiconductor memory device shown in FIG. 4.

FIG. 1 is a view schematically showing the plan layout of the row-selection mechanism 1 or the column-selection mechanism 2 in the semiconductor memory device shown in FIG. 4.

As shown in FIG. 1, the row- or (or and) column-selection mechanism 1 or (or and) 2 includes an array 13 (or circuit group stage CA) of core circuits, such as row decoders or column decoders, and an array 14 (or circuit group stage CB) of control circuits corresponding to the core circuits. The control circuits of the array 14 are formed of, e.g., pre-decoders for aiding decoding operations, and fuses, fuse latch circuits, and redundancy control circuits constituting redundancy circuits for relieving defects, and the like.

The core circuit array 13 constituting the circuit group stage CA has an m-number of core circuit units 13g which are substantially the same as or equivalent to each other. Each of the core circuit units 13g consists of an n-number of core circuits 13r which form decoders, respectively. The n-number of core circuits 13r are disposed side by side in a first direction D1, which is parallel to the row or column directions, to constitute each of the core circuit units 13g. The m-number of core circuit units 13g are disposed side by side in the first direction D1 with a pitch Px to constitute the core circuit array 13.

On the other hand, the control circuit array 14 constituting the circuit group stage CB, which is arranged adjacent to the circuit group stage CA, has an m-number of control circuit units 14g which are substantially the same as or equivalent to each other. The control circuit units 14g are connected to the core circuit units 13g by interconnection wiring lines, respectively. The m-number of control circuit units 14g are disposed side by side in the first direction D1 with a pitch Py to constitute the control circuit array 14.

Note that each of the core circuit units 13g is constituted by repeatedly disposing substantially the same core circuit, while each of the control circuit units 14g is not necessarily constituted by repeatedly disposing substantially the same circuit. Even where each of the control circuit units 14g is constituted by repeatedly disposing substantially the same circuit, the repeated base and the repeating method, e.g., the repeated number, have no relation to those of the core circuits.

Figure 3A:
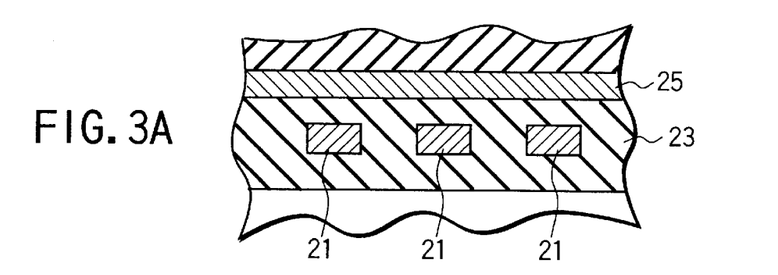
FIG. 3A is a cross-sectional view showing wiring layers arranged on levels different from each other.

Wiring lines for constituting the circuits of the semiconductor memory device are formed of multi-layer wiring layers arranged on a semiconductor substrate. In the semiconductor memory device shown in FIG. 1, the interconnection wiring lines connecting the core circuit array 13 and the control circuit array 14 are formed of a wiring layer arranged on a level different from that of a wiring layer forming the global address, signal, or power lines which traverse the circuit group stages CA and CB, i.e., extend in the first direction D1. More specifically, as shown in FIG. 3A, a lower level wiring layer 21 and an upper level wiring layer 25, which are separated from each other by an inter-level insulating film 23, may be used for the interconnection wiring lines and the global wiring lines, respectively, or vice versa.

As described above, the pitch Px of the core circuit units 13g and the pitch Py of the control circuit units 14g are set to differ from each other. With this arrangement, the positional relationship between the core circuit units 13g and the control circuit units 14g becomes less restricted, thereby increasing flexibility in design, and particularly in layout.

Further, by satisfying Py<Px, an additional region 15, which is derived from the difference between the pitches Px and Py, can be formed and arranged along with the control circuit units 14g in the first direction D1 (in the core circuit array 14, i.e., the circuit group stage CB). Arranged in the additional regions 15 are non-corresponding circuits, the number of which does not have to be the same as the m-number of the core circuit units 13g, or those ones of the lead-out wiring lines from the core circuit array 13, which cannot pass through in the control circuit units 14g. With this arrangement, the positional relationship between the lead-out wiring lines and the core and control circuit units 13g and 14g becomes less restricted, and the non-corresponding circuits do not come to interfere with other peripheral circuits in the layout of the device. As a result, it is possible to increase flexibility in design, and to decrease the occupation surface area of the device or chip.

The lead-out wiring lines arranged in the additional region 15 may be, e.g., data lines, power lines, or signal lines. The lead-out wiring lines arranged in the additional region 15 are formed of a wiring layer arranged on a level different from that of wiring layers forming the global address, signal, or power lines which traverse the circuit group stages CA and CB, i.e., extend in the first direction D1. More specifically, as shown in FIG. 3A, a lower level wiring layer 21 and an upper level wiring layer 25, which are separated from each other by an inter-level insulating film 23, may be used for the lead-out wiring lines and the global wiring lines, respectively, or vice versa.

The width of the additional region 15 in the first direction D1 may be basically integer-times (generally more than two times) the size of the difference between the pitches Px and Py of the core circuit units 13g and the control circuit units 14g. For example as shown in FIG. 1, where there is only one additional region 15, its width may be almost {m×(Px−Py)}. Where each of additional regions 15 is arranged at every two control circuit units 14g, its width may be almost {2×(Px−Py)}.

Where a plurality of additional regions 15 are arranged, the regions 15 may have different widths. Even in this case, the total width of the additional regions 15 in the first direction D1 may be basically integer-times (generally more than two times) the size of the difference between the pitches Px and Py of the core circuit units 13g and the control circuit units 14g. Note that, however, the ends of the core circuit array 13 and the control circuit array 14 do not have to terminate at the same positions, the width of the additional region or regions 15 can be slightly adjusted in any case.

FIGS. 2A to 2E are views schematically showing modifications of the layout shown in FIG. 1, respectively. In the modifications, a plurality of additional regions for non-corresponding circuits or lead-out wiring lines are arranged in the control circuit array 14 of a row-selection mechanism 1 or a column-selection mechanism 2. Where the additional regions are set to have the same width, they each have a width of {m×(Px−Py)/(the number of the additional regions)}.

Figure 2A:
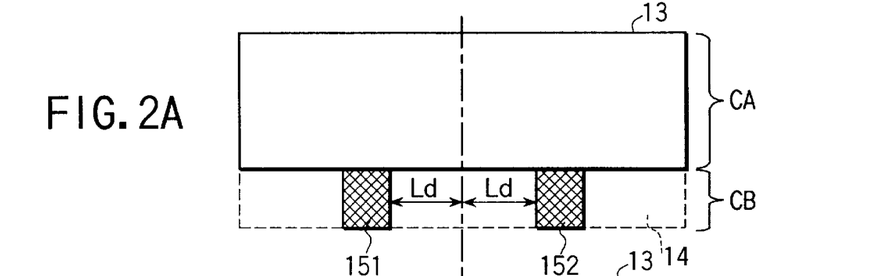
FIGS. 2A to 2E are views schematically showing modifications of the layout shown in FIG. 1, respectively.

In the modification (mirror symmetry) shown in FIG. 2A, two additional regions 151 and 152 having the same size or different sizes are arranged symmetrically relative to the central axis at the center of a core circuit array 13. The additional regions 151 and 152 are each separated from the central axis by a distance Ld.

Figure 2B:
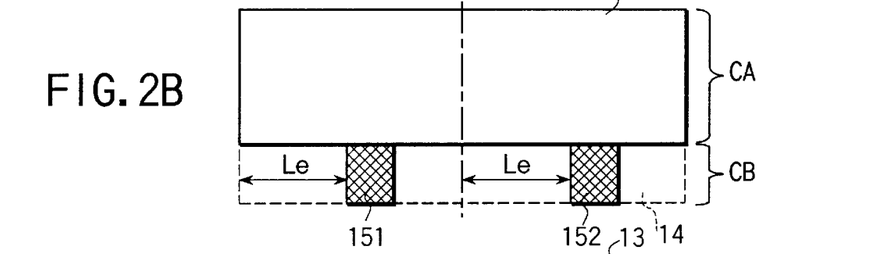

In the modification (parallel arrangement) shown in FIG. 2B, two additional regions 151 and 152 having the same size or different sizes are arranged in right and left areas, which are formed by symmetrically dividing a control circuit array 14 at the center of a core circuit array 13. The additional regions 151 and 152 are each separated from the left ends of the areas by a distance Le.

Figure 2C:
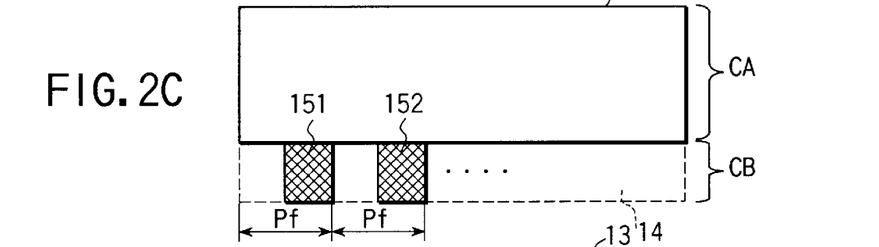

In the modification (repeated arrangement with a pitch Pf) shown in FIG. 2C, a plurality of additional regions 151, 152, and so forth, having the same size or different sizes are arranged in a repeated manner with a pitch Pf larger than the width of each additional region.

Figure 2D:
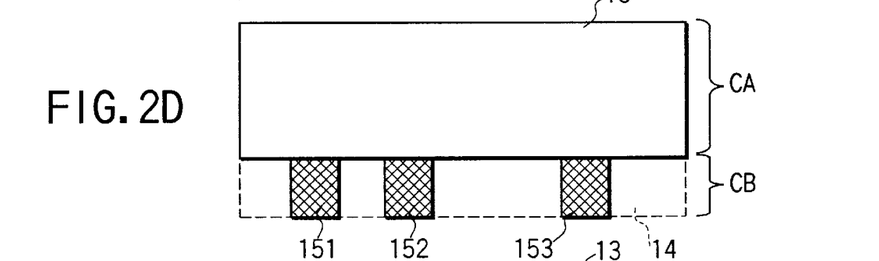

In the modification (random arrangement) shown in FIG. 2D, a plurality of additional regions 151, 152, 153, and so forth, having the same size or different sizes are arranged in a random manner.

Figure 2E:
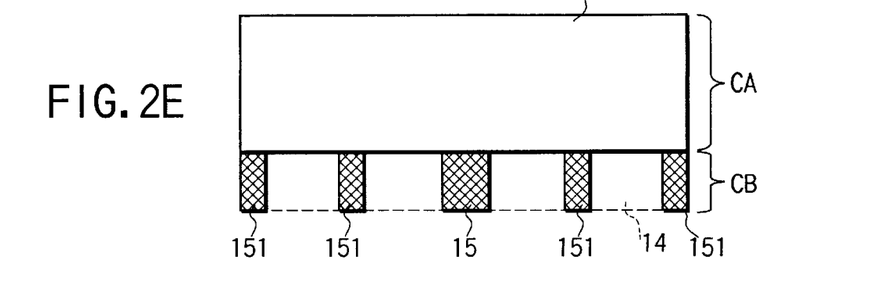

In the modification shown in FIG. 2E, an additional region 15 having a large width is arranged at the center of the control circuit array 14, while each of additional regions 151 having a small width is arranged at every two control circuit units 14g.

Figure 3B:
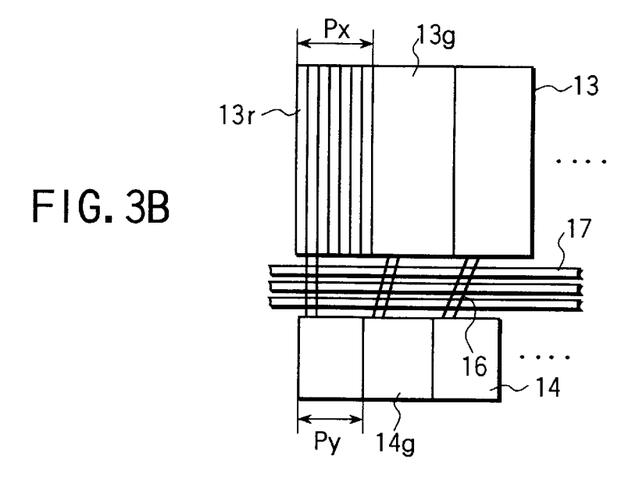
FIG. 3B is a view schematically showing the plan layout of a modification where a core circuit array and a control circuit array are separated with a gap therebetween and connected by interconnection wiring lines.

FIG. 3B is a view schematically showing the plan layout of a modification where a core circuit array 13 and a control circuit array 14 are separated with a gap therebetween and connected by interconnection wiring lines 16.

As shown in FIG. 3B, due to the difference between the pitches Px and Py of core circuit units 13g and control circuit units 14g, some of the interconnection wiring lines 16 are formed to have inclined wiring portions, respectively, each of which extends at an angle relative to the row and column directions, i.e., a first direction D1 and a second direction D2 perpendicular to the first direction D1. As described above, the interconnection wiring lines 16 are formed of a wiring layer arranged on a level different from that of a wiring layer forming the global address, signal, or power lines 17 which traverse the circuit group stages CA and CB, i.e., extend in the first direction D1, so that they do not interfere with each other.

Note that, although the inclined wiring portions of the interconnection wiring lines 16 are shown to have different angles in FIG. 3B, the inclined wiring portions may have the same angle, e.g., 45°. In this case, the interconnection wiring lines 16 are formed by combining the inclined wiring portions and horizontal and vertical wiring portions extending in the first and second directions D1 and D2, respectively.

Figure 5A:
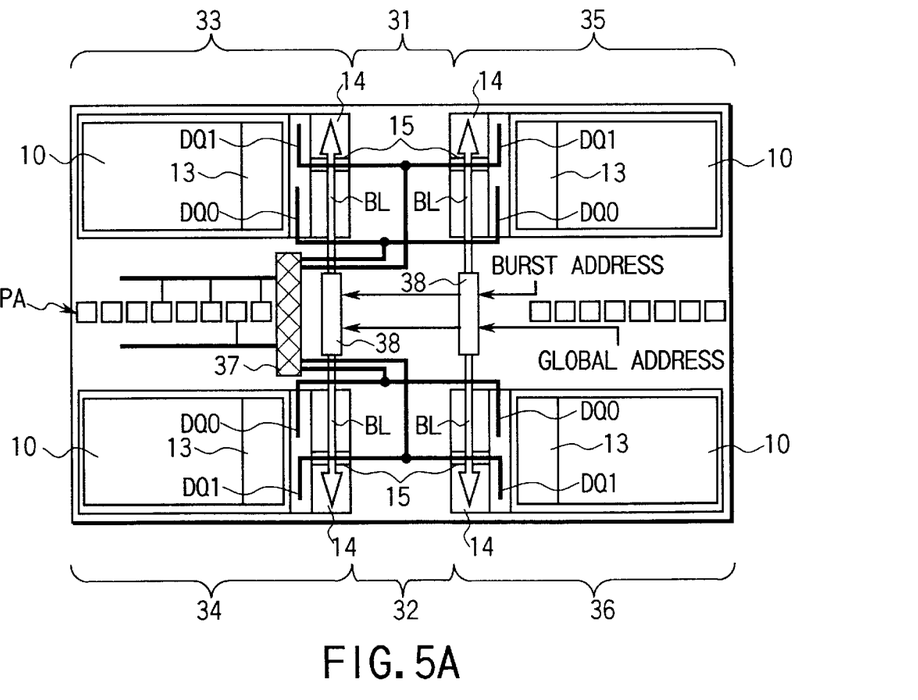
FIGS. 5A and 5B are views schematically and partly showing the plan layouts of synchronous DRAMs (SDRAMs) which exemplify semiconductor memory devices according to another embodiment of the present invention and a related art, respectively.
Figure 5B:
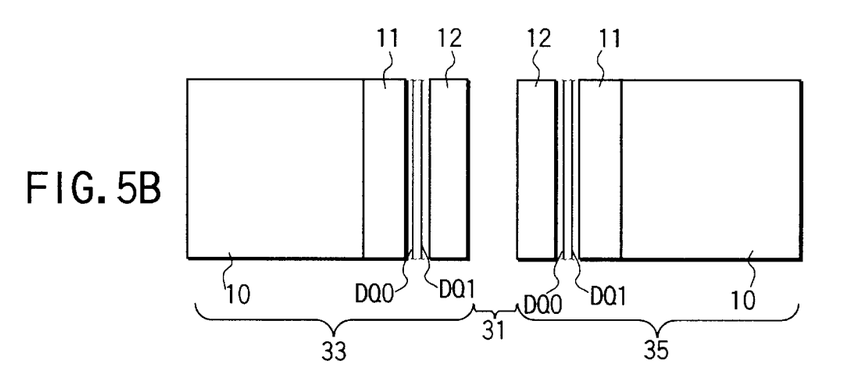

FIGS. 5A and 5B are views schematically and partly showing the plan layouts of synchronous DRAMs (SDRAMs) which exemplify semiconductor memory devices according to another embodiment of the present invention and a related art, respectively.

As shown in FIG. 5A, this SDRAM has a plurality of banks constituting independent memory blocks, e.g., four banks 33, 34, 35, and 36 arranged side by side with gap sections 31 and 32 interposed therebetween. Each of the banks 33 to 36 includes a memory cell array 10, a core circuit array 13 forming decoders or second sense amplifiers, and a control circuit array 14 corresponding to the core circuit. Between the core circuit array 13 and the control circuit array 14, there are data lines DQ1 and DQ2, which are referred to as lead-out wiring lines from the core circuit array.

In each control circuit array 14, an additional region 15 is arranged by setting the pitches of the core and control circuit units 13g and 14g to satisfy Py<Px, as shown in FIG. 1. The data lines DQ1 of the banks 33 and 35 are led out through the corresponding additional regions 15, and connected to each other in the gap section 31, while the data lines DQ1 of the banks 34 and 36 are led out through the corresponding additional regions 15, and connected to each other in the gap section 32. In FIG. 5A, there are further shown a multiplexer 37, a terminal pad array PA, core bus drivers 38, and core address buses BL.

On the other hand, in the SDRAM shown in FIG. 5B, data lines DQ1 and DQ2 arranged between a core circuit array 11 and a control circuit array 12 in one bank 33 or 35 are independent from their counterparts in the other bank 35 or 33, and led out laterally from the bank 33 or 35.

Although each of the data lines DQ1 and DQ2 is shown only with one line in FIGS. 5A and 5B for the sake of simplicity of the drawings, each of the data lines is formed of a plurality of, e.g., eight, lines, depending on the bit number in practice. Consequently, as compared to the structure shown in FIG. 5B, the structure shown in FIG. 5A, according to the present invention, can decrease the width of the device or chip. Since there is no case where data items are output simultaneously from data lines of a plurality of banks, it is possible to commonly use data lines in such a manner.

Further, as described with reference to FIG. 3A, the interconnection wiring lines 16 connecting the core circuit array 13 and the control circuit array 14 are formed of a wiring layer arranged on a level different from that of the data lines DQ1 and DQ2 between the arrays 13 and 14. Consequently, the interconnection wiring lines 16 do not interfere with the data lines DQ1 and DQ2, in spite of the difference between the pitches of the core and control circuit units 13g and 14g. As a result, therefore, the difference between the pitches does not result in an increase in the width of the device or chip.

Figure 6:
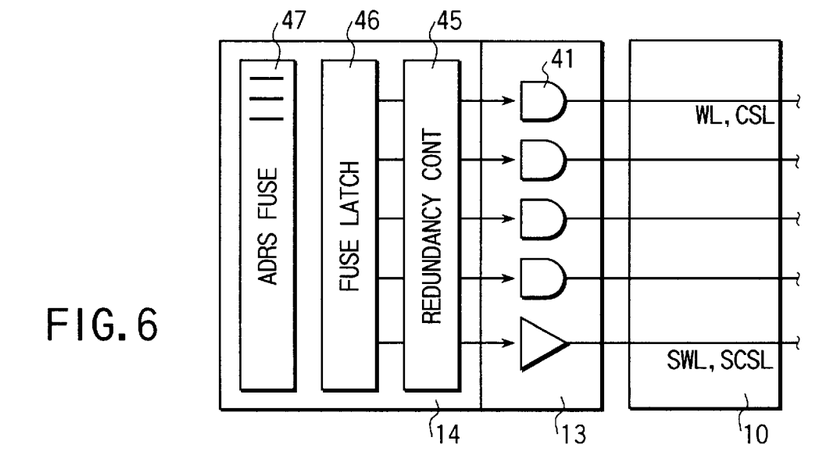
FIG. 6 is a block diagram showing the relationship among a memory cell array, a core circuit array, and a control circuit array in the SDRAM shown in FIG. 5A.

FIG. 6 is a block diagram showing the relationship among the memory cell array 10, the core circuit array 13, and the control circuit array 14 in the SDRAM shown in FIG. 5A.

As shown in FIG. 6, the core circuit array 13 has a (n×m)-number of decoders 41, i.e., row decoders or column decoders. The control circuit array 14 corresponding to the core circuit array 13 is constituted by pre-decoders (not shown), redundancy control circuits 45, fuse latch circuits 46, and address fuses 47.

The memory cell array 10 includes memory cells arranged in a matrix format, and spare elements or redundancy elements for relieving defective memory cells by acting as substitute. In the memory cell array 10, when a certain memory cell is selected, a word line WL and a column-selection line CSL are selected by the row and column decoders on the basis of address signals.

The pre-decoders (not shown) and the address fuses 47 accompanied with the redundancy control circuits 45 and the fuse latch circuits 46 constitute the control circuit array 14. The control circuit array 14 is located adjacent to the core circuit array 13 including the row or column decoders.

In the SDRAM described above, the pitches Px and Pu of the core and control circuit units 13g and 14g are set to satisfy Py<Px. The additional region 15 is formed in the control circuit array 14, utilizing the difference between the pitches Px and Py. Arranged in the additional region 15 are non-corresponding circuits, the number of which does not have to be the same as the m-number of the core circuit units 13g, or lead-out wiring lines from the core circuit array 13. With this arrangement, the positional relationship between the lead-out wiring lines and the core and control circuit units 13g and 14g becomes less restricted, and the non-corresponding circuits do not come to interfere with other peripheral circuits in the layout of the device. As a result, it is possible to increase flexibility in design, and to decrease the occupation surface area of the device or chip.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor memory device, comprising:

a memory cell array comprising a plurality of memory cells arranged in a matrix format of rows and columns;

a plurality of row lines arranged to correspond to said rows, respectively, for selecting said memory cells along said rows;

a plurality of column lines arranged to correspond to said columns, respectively, for selecting said memory cells along said columns;

a row-selection mechanism connected to said row lines for selecting said row lines, based on address signals;

a column-selection mechanism connected to said column lines for selecting said column lines, based on address signals; and a circuit section for writing and reading data into and from memory cells in said memory cell array, selected in sequence by means of cooperation of said row- and column-selection mechanisms, wherein at least one of said row- and column-selection mechanisms comprises a core circuit array and a control circuit array arranged adjacent to said core circuit array, said core circuit array comprises an m-number of core circuit units which are substantially equivalent to each other, and each of which consists of an n-number of core circuits forming decoders, respectively, said control circuit array comprises an m-number of control circuit units which are substantially equivalent to each other, and are connected to said core circuit units by interconnection wiring lines, respectively, and said core circuit units and said control circuit units are arranged in a first direction with first and second pitches, respectively, which differ from each other.

2. The device according to claim 1, wherein each of said interconnection wiring lines has a wiring portion extending at an angle relative to said first direction and a second direction perpendicular to said first direction.

3. The device according to claim 2, wherein said wiring portion and a group of wiring lines extending in said first direction are formed of wiring layers, respectively, which are arranged on levels different from each other with an inter-level insulating film interposed therebetween.

4. The device according to claim 1, wherein each of said control circuit units comprises at least one selected from a group consisting of pre-decoders, fuses, fuse latch circuits, and redundancy control circuits.

5. The device according to claim 4, wherein said core circuit array and said control circuit array belong to said column-selection mechanism.

6. The device according to claim 1, wherein said second pitch is smaller than said first pitch, so that an additional region derived from a difference between said first and second pitches is arranged along with said control circuit units in said first direction, and non-corresponding circuits, the number of which does not have to be the m-number of said core circuit units, or lead-out wiring lines from said core circuit array are arranged in said additional region.

7. The device according to claim 6, wherein said lead-out wiring lines are data lines, power lines, or signal lines.

8. The device according to claim 6, wherein said lead-out wiring lines extend in a direction intersecting said first direction, and a group of said lead-out wiring lines and a group of wiring lines extending in said first direction are formed of wiring layers, respectively, which are arranged on levels different from each other with an inter-level insulating film interposed therebetween.

9. The device according to claim 6, wherein said additional region has such a width in said first direction that is substantially integer-times a difference between said first and second pitches.

10. The device according to claim 6, wherein said additional region is located at a substantial center of said control circuit array, and other additional regions are arranged along with said control circuit units in said first direction such that each of said other additional regions are located at every plural control circuit units.

11. The device according to claim 6, wherein each of said interconnection wiring lines has a wiring portion extending at an angle relative to said first direction and a second direction perpendicular to said first direction.

12. The device according to claim 6, wherein each of said control circuit units comprises at least one selected from a group consisting of pre-decoders, fuses, fuse latch circuits, and redundancy control circuits.

13. The device according to claim 12, wherein said core circuit array and said control circuit array belong to said column-selection mechanism.

14. A semiconductor memory device having first and second blocks arranged side by side with a gap section interposed therebetween, each of said first and second blocks comprising:

a memory cell array comprising a plurality of memory cells arranged in a matrix format of rows and columns;

a plurality of row lines arranged to correspond to said rows, respectively, for selecting said memory cells along said rows;

a plurality of column lines arranged to correspond to said columns, respectively, for selecting said memory cells along said columns;

a row-selection mechanism connected to said row lines for selecting said row lines, based on address signals;

a column-selection mechanism connected to said column lines for selecting said column lines, based on address signals; and a circuit section for writing and reading data into and from memory cell in said memory cell array, selected in sequence by means of cooperation of said row- and column-selection mechanisms, wherein at least one of said row- and column-selection mechanisms comprises a core circuit array and a control circuit array arranged adjacent to said core circuit array, said core circuit array comprises an m-number of core circuit units which are substantially equivalent to each other, and each of which consists of an n-number of core circuits forming decoders, respectively, said control circuit array comprises an m-number of control circuit units which are substantially equivalent to each other, and are connected to said core circuit units by interconnection wiring lines, respectively, said core circuit units and said control circuit units are arranged in a first direction with first and second pitches, respectively, which differ from each other, and said second pitch is smaller than said first pitch, so that an additional region derived from a difference between said first and second pitches is arranged along with said control circuit units in said first direction, and lead-out wiring lines from said core circuit array are arranged in said additional region, and wherein said lead-out wiring lines from said first block and said lead-out wiring lines from said second block are respectively connected in said gap section.

15. The device according to claim 14, wherein said lead-out wiring lines are data lines, power lines, or signal lines.

16. The device according to claim 14, wherein said lead-out wiring lines extend in a direction intersecting said first direction, and a group of said lead-out wiring lines and a group of wiring lines extending in said first direction are formed of wiring layers, respectively, which are arranged on levels different from each other with an inter-level insulating film interposed therebetween.

17. The device according to claim 14, wherein said additional region has such a width in said first direction that is substantially integer-times a difference between said first and second pitches.

18. The device according to claim 14, wherein each of said interconnection wiring lines has a wiring portion extending at an angle relative to said first direction and a second direction perpendicular to said first direction.

19. The device according to claim 14, wherein each of said control circuit units comprises a least one selected from a group consisting of pre-decoders, fuses, fuse latch circuits, and redundancy control circuits.

20. The device according to claim 19, wherein said core circuit array and said control circuit array belong to said column-selection mechanism.

* * * * *